(12) United States Patent
Fallah-Adl et al.

(10) Patent No.: US 7,458,815 B2
(45) Date of Patent: Dec. 2, 2008

(54) MODULE TO COUPLE TO A PLURALITY OF BACKPLANES IN A CHASSIS

(75) Inventors: Hassan Fallah-Adl, Chandler, AZ (US); Edoardo Campini, Mesa, AZ (US); Robert J. Albers, Folsom, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 11/393,389

(22) Filed: Mar. 30, 2006

(65) Prior Publication Data

US 2007/0238326 A1    Oct. 11, 2007

(51) Int. Cl.
*H01R 12/00* (2006.01)
(52) U.S. Cl. .......................... 439/61; 361/695; 361/796
(58) Field of Classification Search .................... 439/61, 439/64; 361/690–695, 788, 796
See application file for complete search history.

(56) References Cited

U.S. PATENT DOCUMENTS

| | | | | |
|---|---|---|---|---|
| 2,731,609 A * | 1/1956 | Sobel, III | ...................... | 439/74 |
| 4,017,770 A * | 4/1977 | Valfre | ........................ | 361/756 |
| 4,158,220 A * | 6/1979 | Yamamoto et al. | .......... | 361/796 |
| 4,164,362 A * | 8/1979 | Cobaugh et al. | ............... | 439/64 |
| 4,352,533 A * | 10/1982 | Murase et al. | ................. | 439/74 |
| 4,421,372 A * | 12/1983 | Golden | ........................ | 439/296 |
| 4,470,100 A * | 9/1984 | Rebaudo et al. | ............. | 361/785 |
| 4,631,637 A * | 12/1986 | Romania et al. | ............. | 361/788 |
| 4,789,352 A * | 12/1988 | Kreinberg et al. | ........... | 439/260 |
| 4,860,163 A * | 8/1989 | Sarath | ......................... | 361/695 |
| 5,618,197 A * | 4/1997 | Bodahl-Johnsen | .......... | 439/260 |
| 7,280,356 B2 * | 10/2007 | Pfahnl et al. | ................. | 361/695 |
| 2006/0126292 A1 * | 6/2006 | Pfahnl et al. | ................. | 361/695 |

* cited by examiner

*Primary Examiner*—Neil Abrams
(74) *Attorney, Agent, or Firm*—Blakely, Sokoloff, Taylor & Zafman LLP

(57) ABSTRACT

A chassis includes a plurality of slots to receive modules. The chassis further includes a first backplane to couple to modules that are received in the plurality of slots. The modules are to couple to the first backplane via a first communication interface on each module. The chassis also includes a second backplane to couple to at least a subset of the modules via a second communication interface on each of the subset of modules. One of the backplanes may be located in an upper or lower air plenum and used to interconnect modules slid along the slots from opposite directions. Some of the module connectors may be retractable to enable the modules to move into the chassis. The interface may be electrical, optical inductive or capacitive.

17 Claims, 11 Drawing Sheets

US 7,458,815 B2

MODULE TO COUPLE TO A PLURALITY OF BACKPLANES IN A CHASSIS

BACKGROUND

Modular platform systems are typically used in communication networks where reliability is increased and cost reduced by the use of interoperable pieces. Such interoperable pieces may include modular platform shelves or chassis. Typically, each modular platform chassis receives and couples in communication various interoperable pieces or modules. These modules may include circuit boards or mezzanine cards. These boards or mezzanine cards may include, but are not limited to, blades, carrier boards, processing boards, switches, hubs, etc. Other interoperable modules that are received and coupled in a modular platform chassis may include components such as fans, power equipment modules (PEM), field replaceable units (FRUs), alarm boards, etc.

Some industry initiatives are seeking ways to standardize the way modules in a modular platform system interoperate. One such initiative is the PCI Industrial Computer Manufacturers Group (PICMG), Advanced Telecommunications Computing Architecture (ATCA) Base Specification, PICMG 3.0 Rev. 2.0, published Mar. 18, 2005, and/or later versions of the specification ("the ATCA specification"). Typically modules designed to operate according to the ATCA specification are received in slots in a modular platform chassis. These modules may then couple to a backplane via communication interfaces that are associated with a fabric interface.

DETAILED DESCRIPTION

As mentioned in the background, modules that are received in slots in an ATCA compliant modular platform chassis may couple to a backplane via communication interfaces that are associated with a fabric interface. As a result, in one example, these modules may couple in communication via the fabric interface to each other through one or more communication channels that are routed over the backplane. These communication channels may be used to forward data from each module's fabric interface and then through portions of the communication channel that are routed over the backplane and/or through other elements in the ATCA modular platform chassis (e.g., switches or hubs). At least a portion of the data, for example, is forwarded to other modules coupled to the backplane.

Typically, a single backplane in a modular platform chassis is limited in the number of communication channels allocated to forward data from a module that couples to it via a fabric interface. For example, a type of ATCA compliant modular platform chassis is designed to receive and couple in communication 16 modules. For this ATCA design, 14 modules or boards may be coupled in communication through two switch modules. This configuration is referred to in the ATCA specification as a dual-star fabric topology. In a dual-star fabric topology, according to the ATCA specification, no more than one communication channel is provided to a non hub/switch module to forward data to another module via its fabric interface when coupled to an ATCA backplane. A single communication channel may result in a bottleneck for data forwarded from this non hub/switch module. This bottleneck is problematic to the throughput of data forwarded through a module's fabric interface when the module is coupled to a single backplane and also limits the throughput capability of a modular platform system.

In one example, a chassis includes a plurality of slots to receive modules. The chassis includes a first backplane to couple to modules that are received in the slots. The modules are to couple via a first communication interface on each module. A second backplane is also included in the chassis. The second backplane is to couple to at least a subset of the modules. The subset of the modules to couple via a second communication interface on each of the subset of modules.

Figure 1:
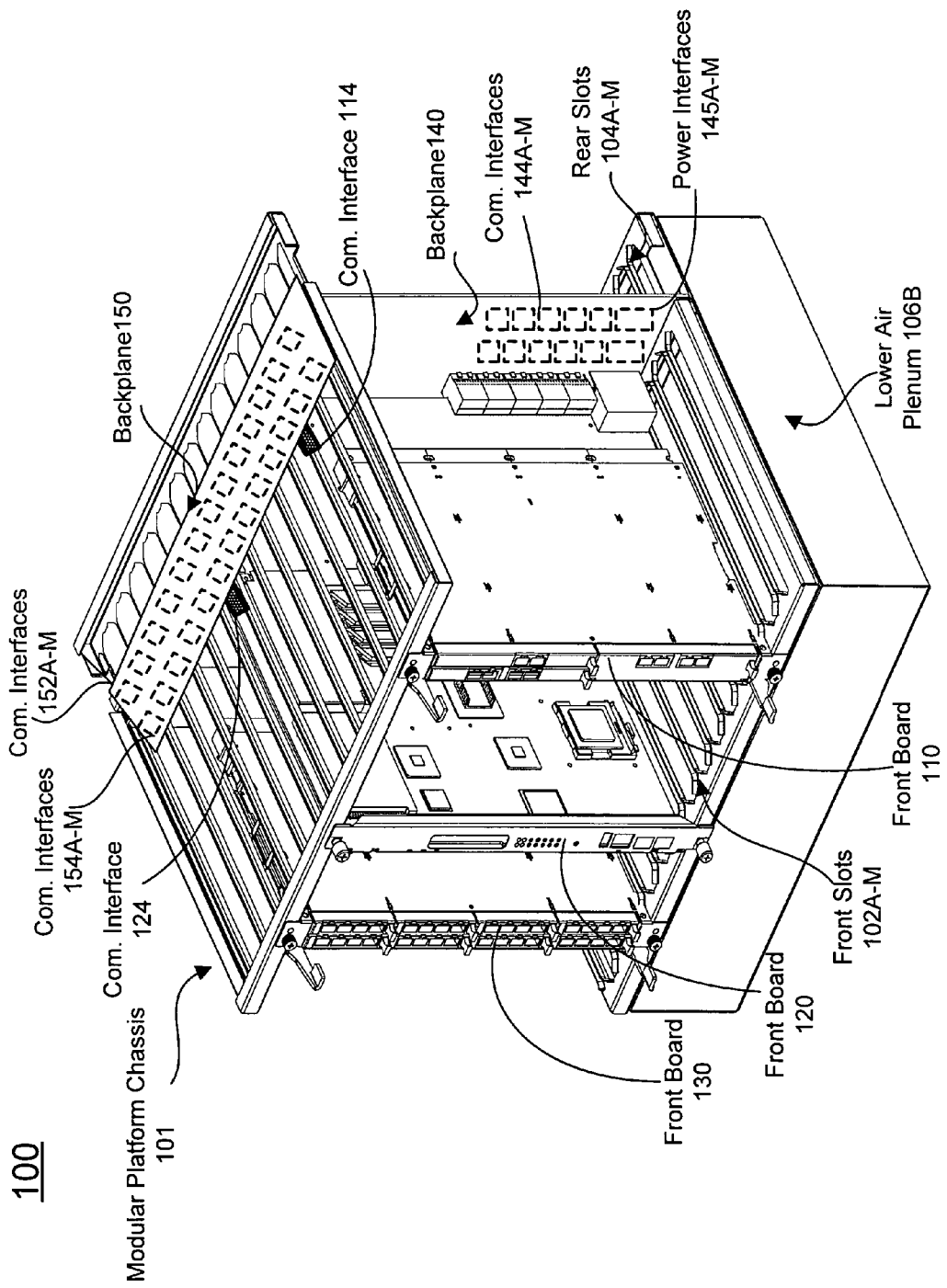
FIG. 1 provides a partial view of an example modular platform system with modules coupled to backplanes in an modular platform chassis.

FIG. 1 provides a partial view of an example modular platform system 100 with modules coupled to backplanes in modular platform chassis 101. As depicted in FIG. 1, modules (e.g., front boards) 110, 120 and 130 are received in front slots 102C, 102H and 102K from among front slots 102A-M. Modular platform chassis 101 is also shown as including rear slots 104A-M to receive modules (e.g., rear transition modules (RTMs). The partial view of modular platform chassis 101 also shows lower air plenum 106B. As described below, modular platform 100 also includes an upper air plenum 106A. These upper and lower air plenums, for example, facilitate the flow of air into and out of modular platform chassis 101.

In one implementation, modular platform chassis 101 includes a plurality of backplanes to couple to modules that are received in its front or rear slots. For example, the plurality of backplanes includes backplanes 140 and 150. These backplanes may couple to modules inserted or received in front slots 102A-M, (e.g., front boards 110, 120 or 130) or in rear slots 104A-M (e.g., RTMs—not shown).

Backplane 140, as depicted in FIG. 1, includes communication interfaces 142A-M and power interface 145A-M. In one implementation, communication interfaces 142A-M couple to communication interfaces on modules received in front slots 102A-M. For example, communication interface 142C couples to communication interface 112 on front board 110. Power interfaces 145A-M, in one example, provide power to modules received in front slots 102A-M. For example, power interface 145C couples to power interface 115 on front board 110 to provide power to front board 110.

Backplane 150, as depicted in FIG. 1, includes communication interfaces 152A-M and 154A-M. In one implementation, communication interfaces 152A-M couple to modules received in front slots 102A-M and communication interfaces 154A-M couple to modules received in rear slots 104A-M. For example, communication interfaces 152C and 152H couple to communication interfaces 112 and 122, respectively, on front boards 110 and 120. In another example, communication interfaces 154C and 154H may couple to communication interfaces on RTMs (not shown) received in rear slots 104C and 104H, respectively.

In one example, modular platform chassis 101 is designed to operate in compliance with the ATCA specification. Additionally, backplane 140 and modules received in front slots 102A-M or rear slots 104A-M (e.g., front boards 110, 120, 130 or RTMs) may also be designed to operate in compliance with the ATCA specification, although this disclosure is not limited to only ATCA complaint modular platform chassis, backplanes and modules but may also apply to Compact Peripheral Component Interface (cPCI), VersaModular Eurocard (VME), or other types of industry standards governing the design and operation of chassis, backplanes and modules. In addition, this disclosure may also apply to proprietary chassis, backplanes and modules designed to operate in a modular platform system.

In one implementation, communication interface 112 on front board 110 is to couple to backplane 140 in an ATCA backplane region called "zone 2". The ATCA specification refers to zone 2 as the data transport connector zone. In this implementation, communication interface 112 is associated with a "base" interface and a "fabric" interface that couple to backplane 140 via one or more interconnects. The fabric interface associated with communication interface 112 is used to forward data and/or instructions through a communication channel, a portion of which is routed over backplane 140. At least some of the data, for example, is forwarded to other modules received in front slots 102A-M and/or rear slots 104A-M.

In one example, an ATCA compliant modular platform chassis 101 is configured in a dual-star fabric topology. As mentioned above, a single communication channel is provided to a module coupled to an ATCA compliant backplane to forward data from the non hub/switch module's fabric interface through that single communication channel. So in this example, communication interface 112 on front board 110 couples to communication interface 142C and data is forwarded from the fabric interface associated with communication interface 142C and then through portions of the communication channel routed over backplane 140. At least a portion of the data, in this dual-star example, is forwarded through switch or hub modules and then to other modules that are coupled to backplane 140 (e.g., front boards 120 or 130) or to modules remotely located to modular platform chassis 101.

In one implementation, as described in more detail below, communication interfaces 152A-M and 154A-M on backplane 150 may couple to communication interfaces on modules received in front slots 102A-M or rear slots 104A-M. This may provide additional communication channels for these modules to forward data from fabric interfaces associated with their communication interfaces coupled to these backplane 150 communication interfaces. For example, a fabric interface associated with communication interface 114 on front board 110 couples to a communication channel routed over backplane 150 via communication interface 152C. Data, for example, is forwarded through the fabric interface and then through the communication channel routed to communication interface 152C and over backplane 150 and then possibly through/to other modules coupled to either backplane 140 or backplane 150.

In one implementation, a fabric interface for a module received in modular platform chassis 101 may be designed to support one or more packet-based communication protocols. Several packet-based communication protocols, for example, are associated with and/or described by sub-set specifications to the ATCA specification and are typically referred to as the "PICMG 3.x specifications." The PICMG 3.x specifications include, but are not limited to, Ethernet/Fibre Channel (PICMG 3.1), Infiniband (PICMG 3.2), StarFabric (PICMG 3.3), PCI-Express/Advanced Switching (PICMG 3.4), Advanced Fabric Interconnect/S-RapidIO (PICMG 3.5) and Packet Routing Switch (PICMG 3.6).

In one example, a fabric interface associated with communication interface 112 or a fabric interface associated with communication interface 124 may support a communication protocol described in a PICMG 3.x specification. This PICMG 3.x specification support, for example, is to facilitate the forwarding of data and/or instructions from front board 110 and through portions of the communication channels routed over backplanes 140 or 150.

In other implementations, a fabric interface for a module received in modular platform chassis 101 may be designed to support other types of communication protocols. For example, the fabric interface may support time division multiplexing (TDM) and/or frequency division multiplexing (FDM). A fabric interface that supports TDM, for example, may operate in compliance with one or more industry standards associated with optical interconnects. One such industry standard is the Optical Internetworking Forum (OIF), TFI-5: TDM Fabric to Framer Interface Implementation, published September, 2003 and/or later versions ("the TFI-5 specification").

In one example, fabric interfaces associated with communication interfaces on modules that couple to backplane 140 in modular platform chassis 101 operate in compliance with one or more packet-based PICMG 3.x specifications. In this example, fabric interfaces associated with communication interfaces on modules that couple to backplane 150 operate in compliance with a TDM-based standard such as the TFI-5 specification. Thus, in this example, packet-based communication protocols are used to forward data from modules via communication channels routed over backplane 140 and TDM-based communication protocols are used to forward data from modules via communication channels routed over backplane 150.

In one implementation, at least a portion of the backplanes in modular platform chassis 101 may be either active or passive backplanes. For example, a passive backplane may operate in accordance with the ATCA specification and thus includes little to no active circuitry or logic that is resident on the backplane. An active backplane, for example, may be a backplane that includes active circuitry or logic that is resident on the backplane.

Figure 2A:
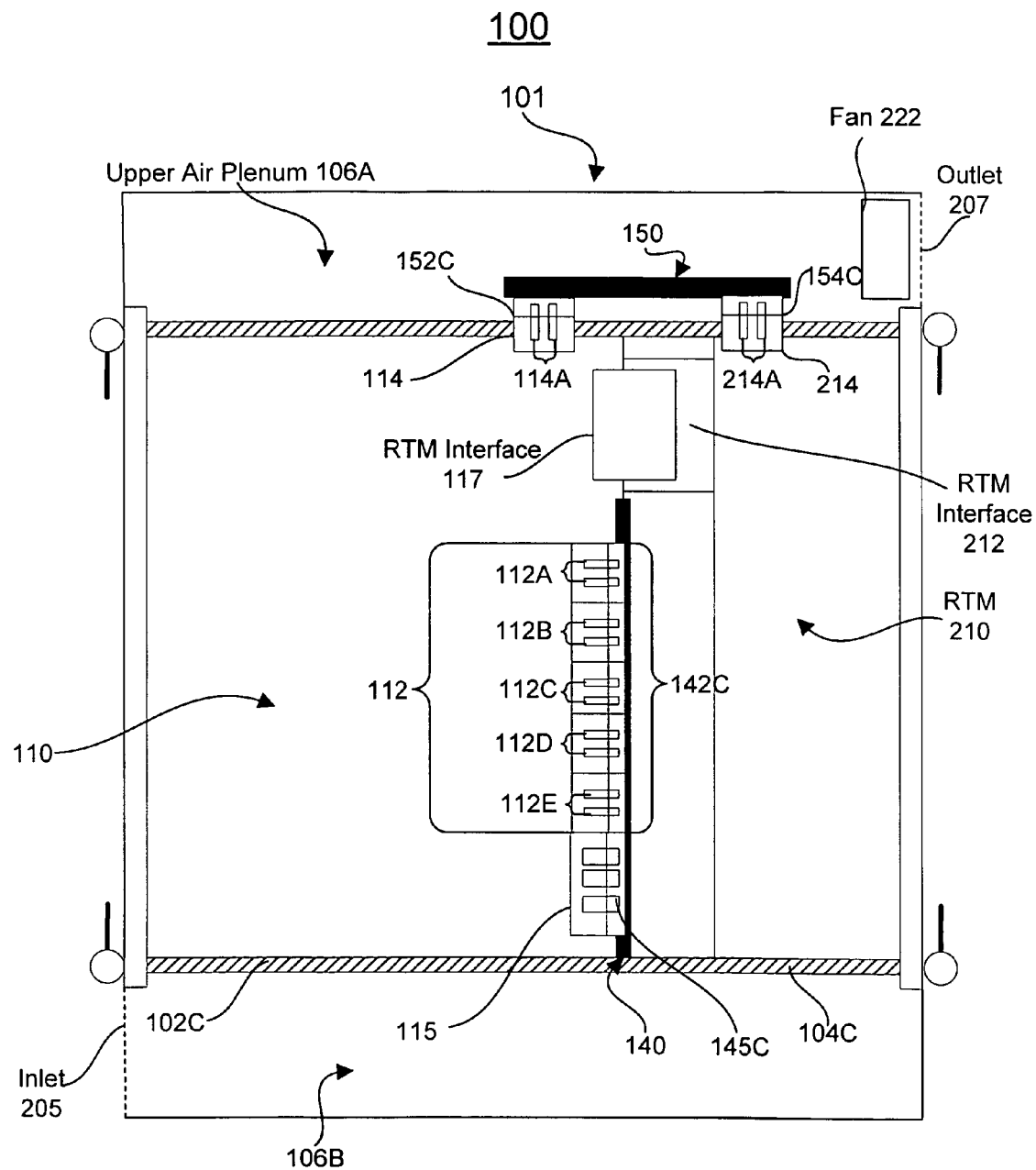
FIGS. 2A-B provide side views of a portion of the example modular platform system with two backplanes in the modular platform chassis.

FIG. 2A provides a side view of a portion of modular platform system 100 with two backplanes in modular platform chassis 101. As portrayed in FIG. 2A, in one example, the first backplane is backplane 140 and another backplane is backplane 150. In one example, backplane 150 is located or mounted just above front board 110 and RTM 210 at the lower portion of upper air plenum 106A. Backplane 150, in one example, is designed to be as narrow as possible to reduce the obstruction of air flow as it moves from air inlet 205 to air outlet 207. As described below, backplane 150 may also be placed or mounted at the upper portion of lower air plenum 106B.

In addition to lower air plenum 106B depicted in FIG. 1 for modular platform chassis 101, FIG. 2A depicts an upper air plenum 106A. In one example, lower air plenum 106B has an air inlet 205 and upper air plenum 106A has an air outlet 207. In one implementation, fan 222 is located in upper air plenum 106A and pulls air from air inlet 205 to air outlet 207 to cool elements contained within modular platform chassis 101. This disclosure is not limited to only a fan located in an upper air plenum. The fan may be located anywhere within modular platform chassis 101 to move air to cool elements within modular platform chassis 101.

As described above for FIG. 1, front board 110 includes communication interfaces 112 and 114 that couple to communication interfaces on these two backplanes. Also, FIG. 2A shows a module 210 (e.g., an RTM) coupled to front board 110. RTM 210, in one example, couples to backplane 150 via communication interface 214 and couples to front board 110 via RTM interface 212.

In one implementation, front board 110, backplane 140 and RTM 210 are each designed to operate in compliance with the ATCA specification. As a result, RTM interface 212 on RTM 210 couples to front board 110 via RTM interface 117 in another ATCA connector zone ("zone 3"). In this implementation, RTM 210 receives power when coupled to front board 110 through RTM interface 212. The power, for example, is provided through power feeds (not shown) routed from RTM interface 117. The RTM interfaces on front board 110 and RTM 210, for example, are also associated with at least one fabric interface to forward data over a communication channel between RTM 210 and front board 110.

In one example, communication interface 214 on RTM 210 is associated with a fabric interface through which data is forwarded when communication interface 214 is coupled to backplane 150. Data, for example, is forwarded through this fabric interface and then through portions of a communication channel routed over backplane 150 and through/to other modules coupled to either backplane 140 or backplane 150. As mentioned above, the fabric interface may operate in compliance with one or more communication protocols.

In one implementation, various interconnects are configured to couple the fabric interface associated with the communication interfaces on front board 110 and RTM 220 to communication channels routed over backplanes 140 and 150. These interconnects are portrayed in FIG. 2A as interconnects 112A-E, 114A and 214A. At least one interconnect from among interconnects 112A-E, for example, couples a fabric interface associated with communication interface 112 to a communication channel routed over backplane 140.

In one example, an interconnect is configured to couple a fabric communication interface to a communication channel routed over backplane 140 and/or 150 in an impedance controlled manner (e.g., via copper-based traces). In another example, the interconnect is configured to couple via other manners such as in an optical (e.g., via optical paths), inductive or capacitive manner. These interconnect configurations, for example, may incorporate the use of micro electromechanical systems (MEMS) which may be fabricated using silicon manufacturing technologies.

In one example of an interconnect configured to couple a fabric communication interface to a communication channel in an optical manner includes a two-dimensional (2-D), MEMS-controllable micro lens array that has been integrated with a Vertical-Cavity-Surface-Emitting-Laser (VCSEL) array and a photodiode array. The VCSEL/photodiode arrays, for example, may be packaged in a flip-chip assembly. In one example, the VCSEL/photodiode arrays allow an interconnect to implement an electrical-to-optical conversion and conversely an optical-to-electrical conversion of data forwarded/received through the communication channel coupled to the fabric interface in an optical manner.

In one example of an interconnect configured to couple in an inductive manner, the interconnect includes an out-of-plane, three-turn spiral with micro (very small) coil dimensions. For an example of an interconnect configured to couple in a capacitive manner, the interconnect includes a parallel plate, area-tunable, MEMS capacitor. Although the disclosure is not limited to only the above mentioned interconnect configurations to couple a fabric interface to a communication channel in an impedance controlled, optical, inductive or capacitive manner.

In one example, interconnects 112A-E for an ATCA compliant front board 110 and backplane 140 are high density, impedance controlled connectors as described in the ATCA specification. In this example, based on front board 110's insertion in front slot 102C, interconnects 112A-E couple with communication interface 142C. As a result, a fabric interface associated with communication interface 112 is coupled to a communication channel routed over backplane 140.

In one implementation interconnect 114A on front board 110 and interconnect 214A on RTM 210 are configured to be vertically retractable. For example, prior to the insertion of front board 110 in slot 102C on modular platform chassis 101, interconnect 114A may be in a retracted position. Once inserted, interconnect 114A may change its retracted position such that it couples with communication interface 152C on backplane 150. This coupling may include coupling in an impedance controlled manner or, as described above, may include coupling with an interconnect configured to couple in an optical, an inductive or a capacitive manner. Thus, for example, a fabric interface associated with communication interface 114 is coupled to a communication channel routed over backplane 150 via the vertically retractable interconnect 114A.

In another implementation, interconnect 114A and interconnect 214A are not configured to be vertically retractable but are configured to couple to communication interface 152C or 154C once inserted in slot 102C. This coupling may include coupling in an impedance controlled manner or, as described above, may include a coupling in an optical, an inductive or a capacitive manner.

Figure 2B:
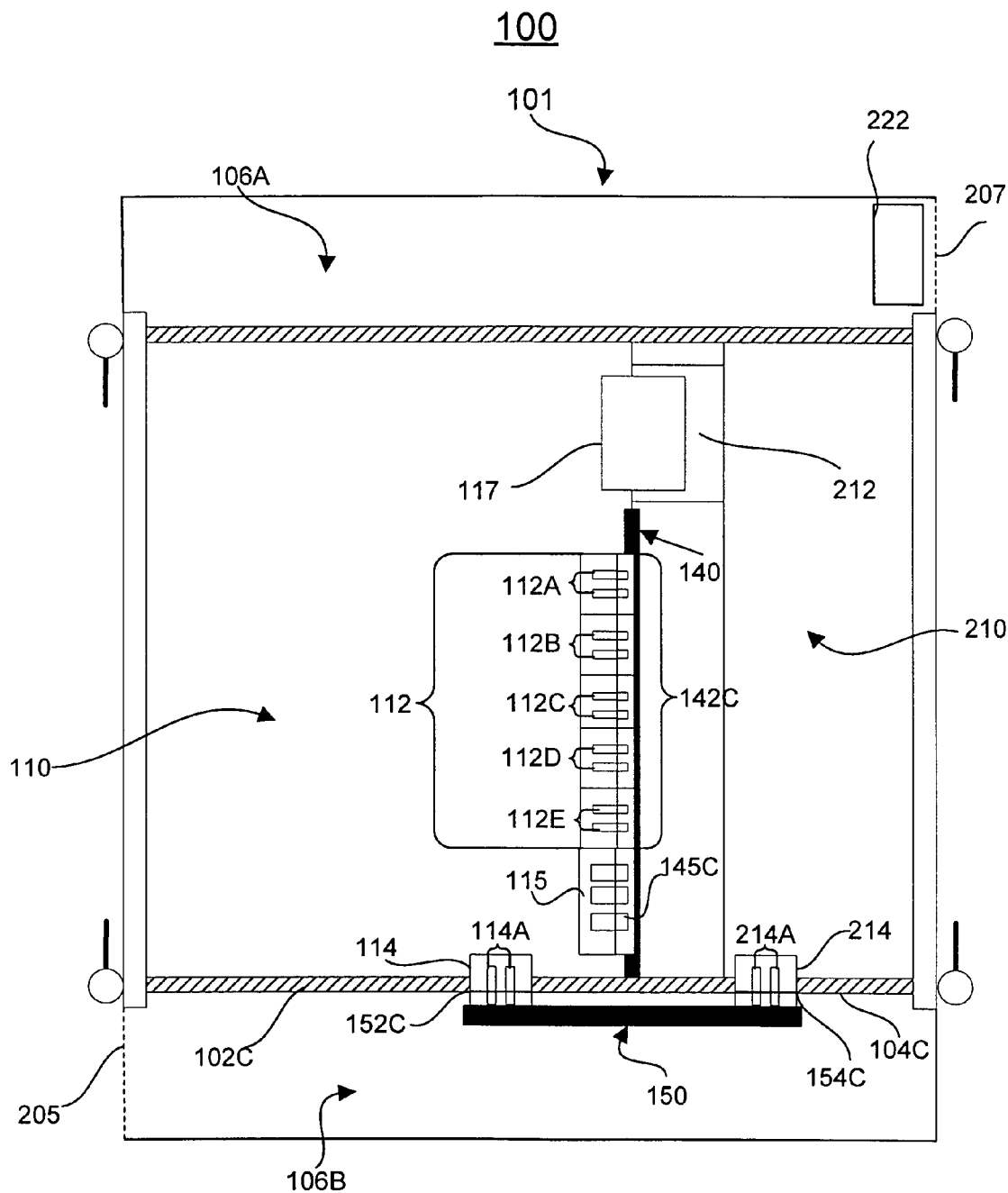

FIGS. 2B provides another side view of a portion of modular platform system 100 with two backplanes in modular platform chassis 101. Similar to FIG. 2A, in one example, one backplane is backplane 140 and another backplane is backplane 150. However, FIG. 2B depicts backplane 150 as located or mounted at the upper portion of lower air plenum 106B. As shown in FIG. 2B, in one example, front board 110 and RTM 210's communication interfaces 114 and 214, respectively, are now located to couple to backplane 150 in this position.

Figure 3A:
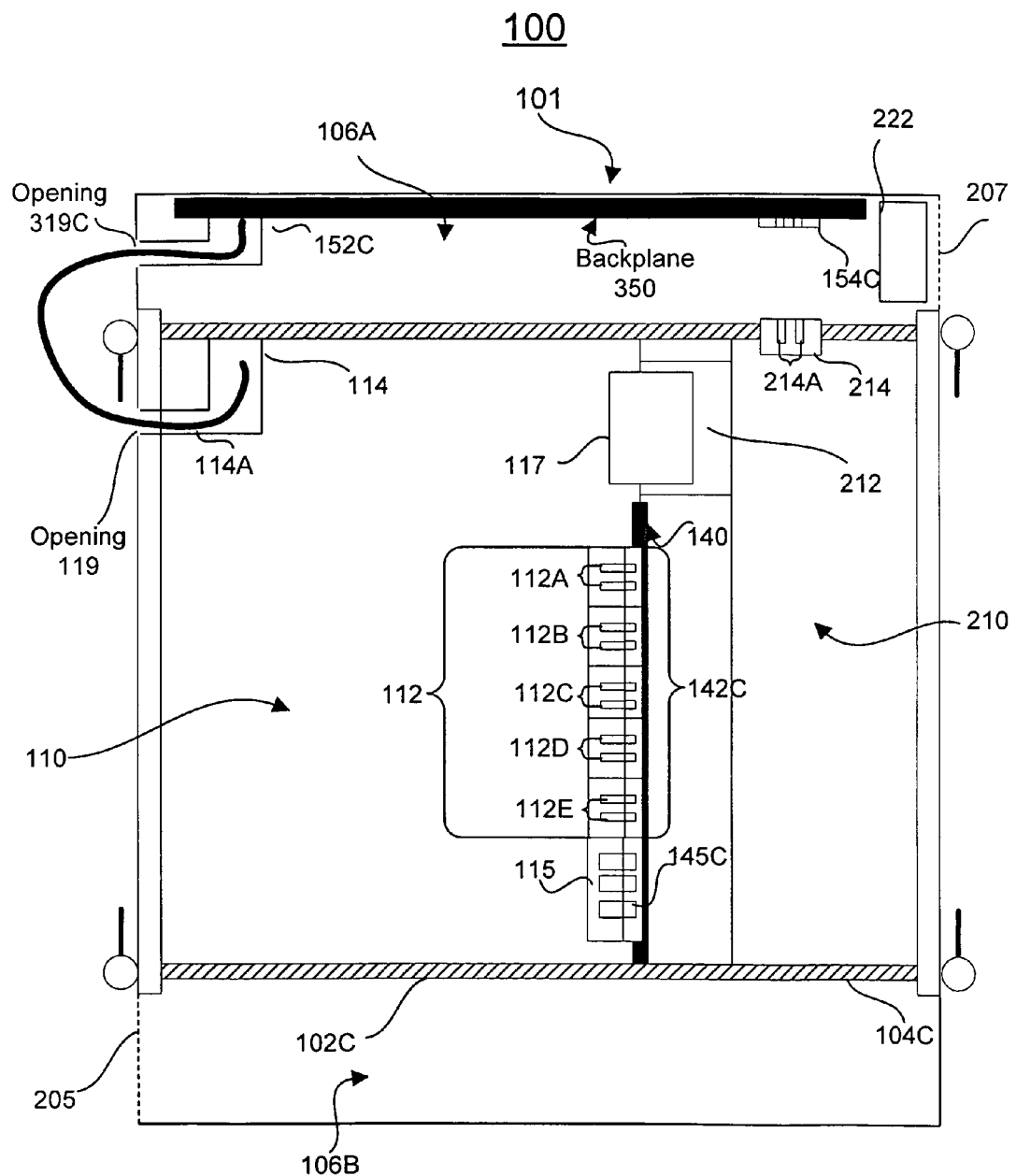
FIGS. 3A-B provide additional side views of a portion of the example modular platform system with two backplanes in the modular platform chassis.

FIG. 3A provides an additional side view of a portion of modular platform system 100 with a first backplane and a second wide backplane in modular platform chassis 101. As shown in FIG. 3A, in one example, the first backplane is backplane 140 as depicted in FIG. 1 and FIGS. 2A-B. In this example, a wide backplane 350 replaces a narrow backplane 150 and is placed or mounted at the upper portion of upper air plenum 106A. Thus, in this example, backplane 350's placement in this position lessens the need to maintain a narrow backplane to reduce the obstruction of air flow as if moves from air inlet 205 to air outlet 207. A wider backplane, for example, may increase the quantity and types of communication channels supported and/or routed through the wider backplane.

In one example, interconnect 114A for communication interface 114 is configured to include a flexible signal medium. This flexible signal medium includes, but is not limited to, a flexible circuit, a ribbon cable, a coaxial cable or an optical glass/plastic fiber. The flexible signal medium, for example is used to couple communication interface 114 to a communication channel that is routed over backplane 350. In one implementation, as shown in FIG. 3A, interconnect 114A passes through opening 119 on front board 110 and opening 319C on modular platform chassis 101. Interconnect 114A may then couple to communication interface 352C on backplane 350. As a result, interconnect 114C couples a fabric interface associated with communication interface 114 to a communication channel that is routed over backplane 350. This coupling may include a coupling in either an impedance controlled, optical, inductive or capacitive manner.

In one example, interconnect 214A is configured to couple in an optical manner to a fabric interface associated with communication interface 214 to a communication channel that is routed to communication interface 154C and over backplane 350. For example, interconnect 214A includes VCSEL/photodiode arrays. Interconnect 214A, for example, is configured to use these VCSEL/photodiode arrays to couple the fabric interface to the communication channel via an optical path. This optical path, for example, includes plastic or glass fibers and/or plastic or glass waveguides that may propagate an optical signal from the VCSEL/photodiode arrays using either single wavelength or wavelength division multiplexing (WDM). In one example, this optical path is routed from interface 214, through the space/gap in upper air plenum 106A and to communication interfaces 154C without the use of flexible signal mediums or retractably configured interconnects.

In other examples, both interconnects 114A and 214A are configured to include flexible signal mediums or both are configured to include VCSEL/photodiode arrays to couple in an optical manner without the use of flexible signal mediums or retractably configured interconnects. In yet other examples, interconnects 114A and 214A are configured to couple in combinations of other types of coupling manners (e.g., impedance controlled, inductive, capacitive, etc.) that may include the use of flexible signal mediums, retractable interconnects or optical pathways routed though spaces or gaps in air plenums.

Figure 3B:
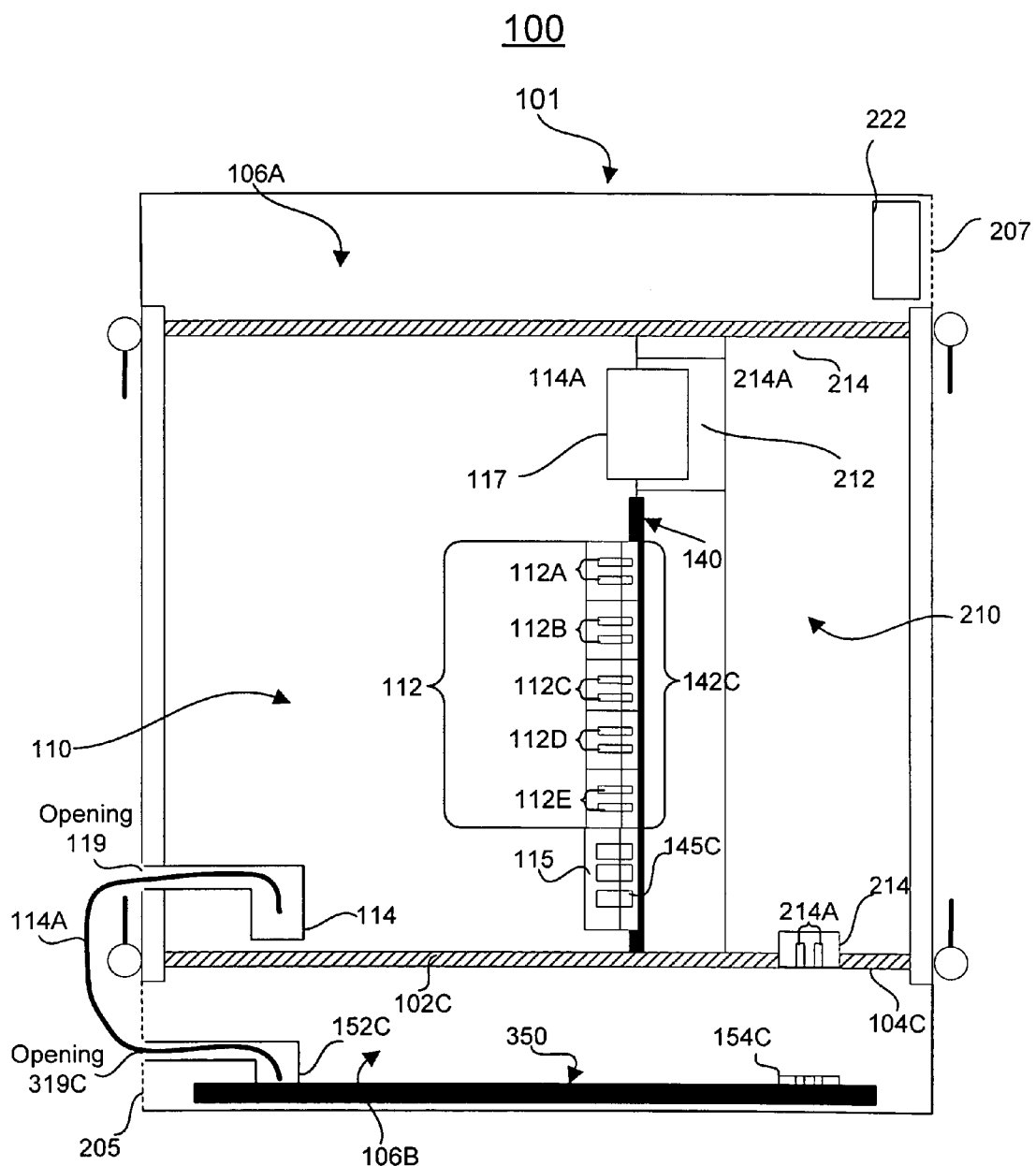

FIG. 3B provides another side view of a portion of modular platform system 100 with first backplane and a second wide backplane in modular platform chassis 101. Similar to FIG. 3A, in one example, the first backplane is backplane 140 and the second narrow backplane is backplane 350. However, FIG. 2B depicts backplane 350 at the bottom portion of the lower air plenum 106B. As shown in FIG. 3B, in one example, front board 10 and RTM 210's communication interfaces 114 and 214, respectively, are now located to couple to backplane 350 in this position.

Although not depicted in FIGS. 3A-B, in one example, interconnect 114A may be configured to couple communication interface 114 to communication interface 152C via a flexible signal medium that is routed between front board 110 and RTM 210. In this example, communication interface 114 is possibly located closer to RTM interface 117 to reduce the length of the flexible signal medium. Additionally, communication interface 152C may be moved to further reduce the length of the flexible signal medium.

Figure 4A:
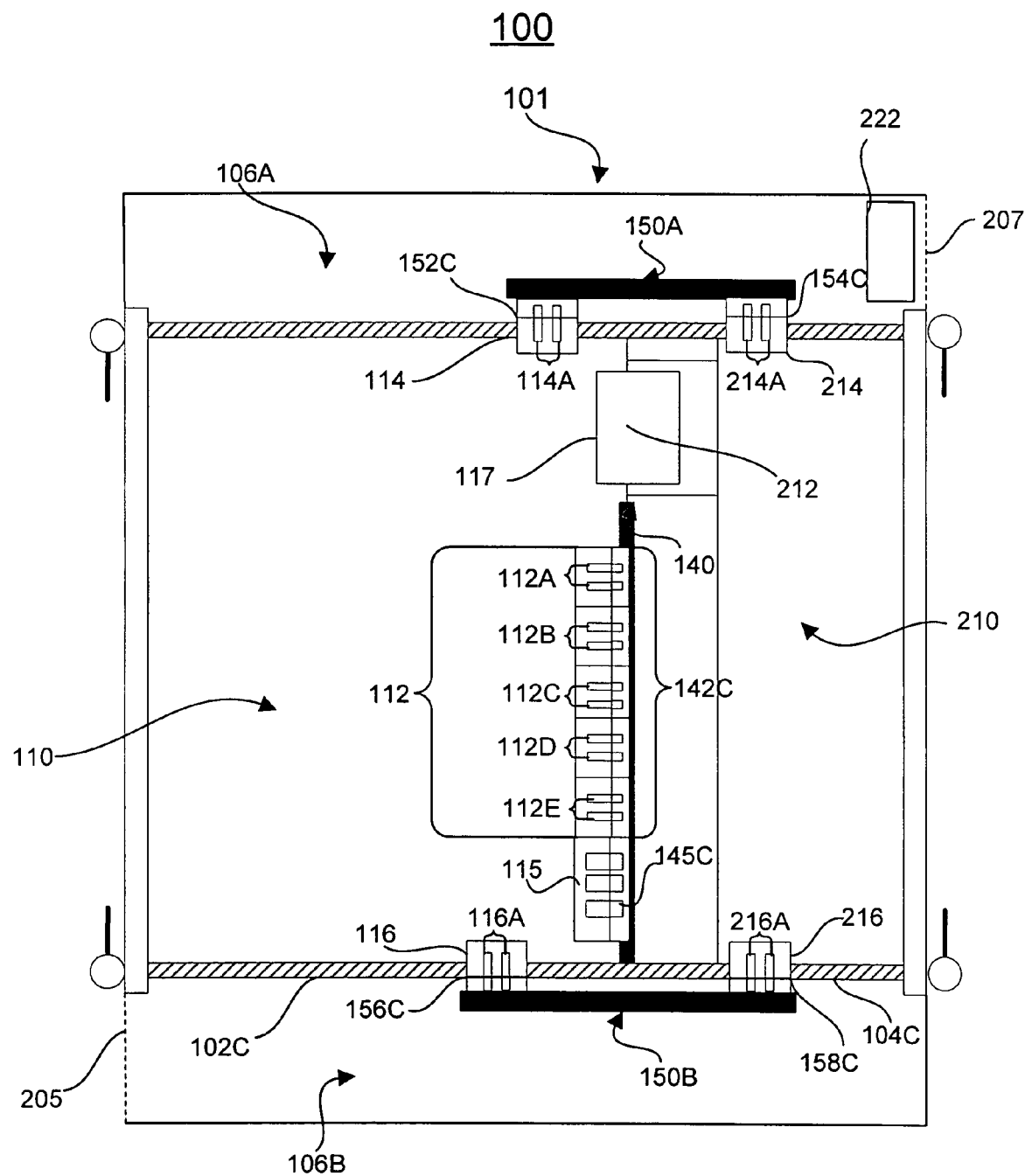
FIGS. 4A-C provide side views of a portion of the example modular platform chassis with three backplanes.
Figure 4B:
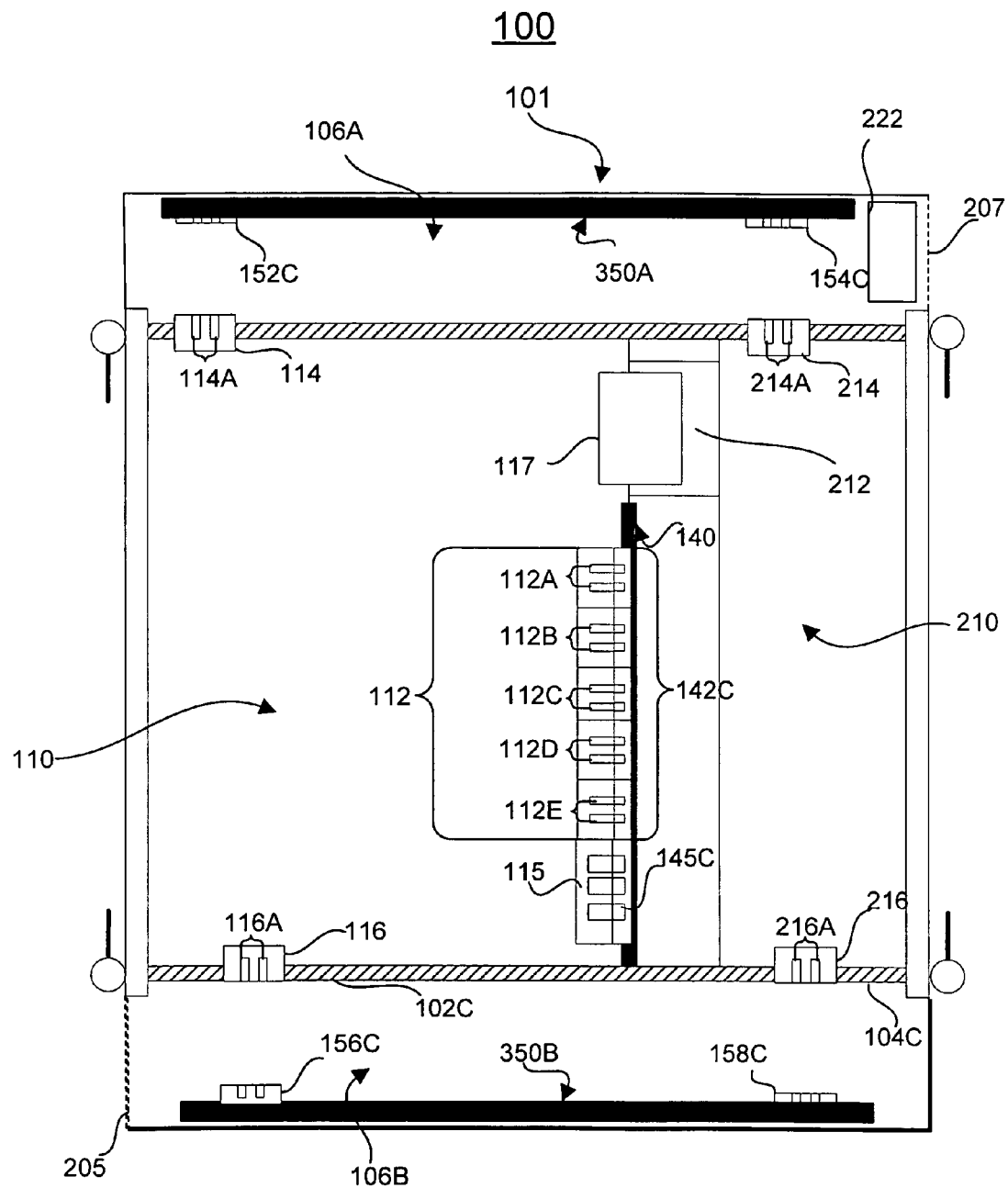
Figure 4C:
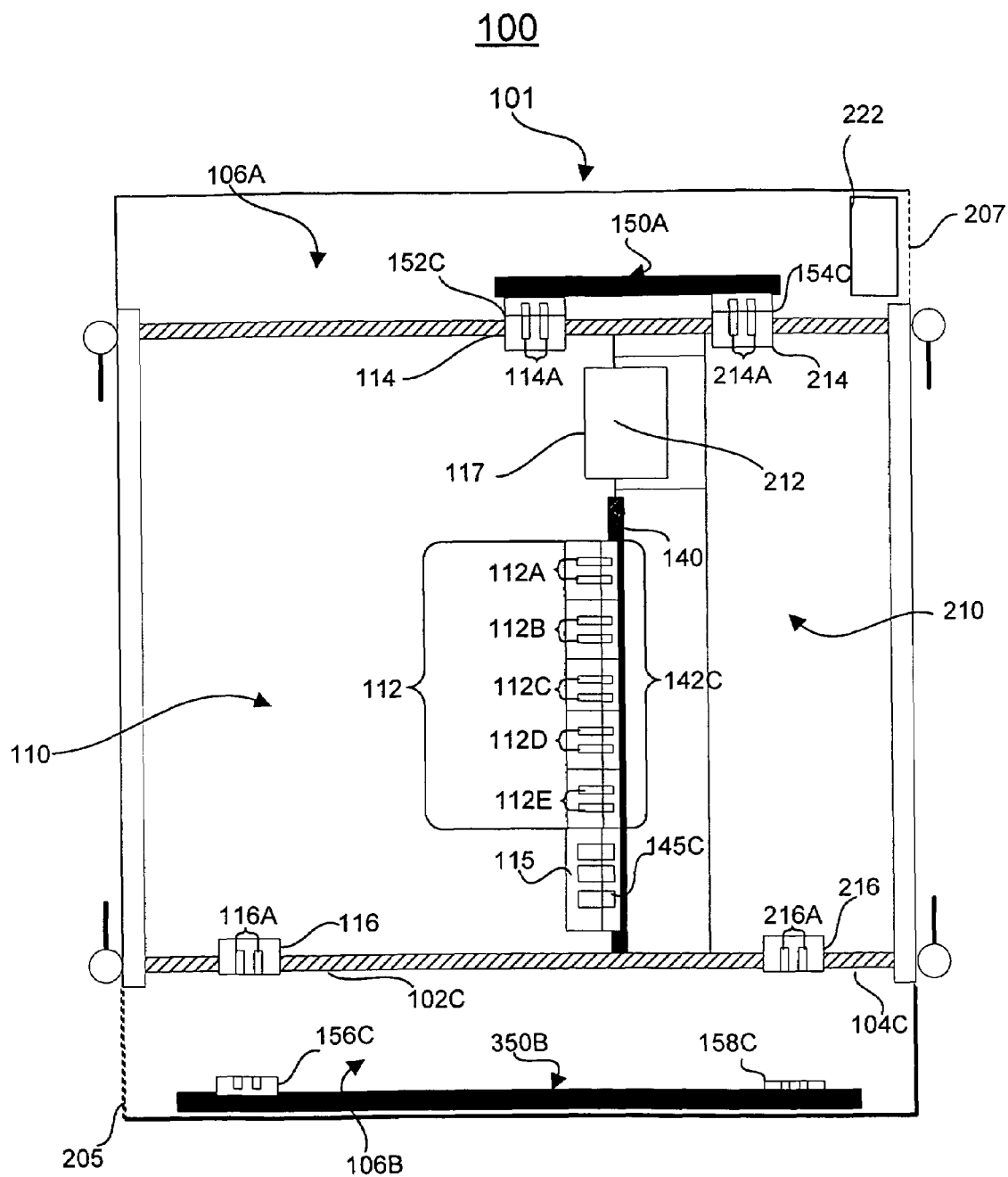

FIGS. 4A-C provide side views of a portion of modular platform system 100 with three backplanes in modular platform chassis 101. FIG. 4A depicts modular platform chassis 101 with backplane 140 and two example narrow backplanes, backplane 150A and backplane 150B. FIG. 4B shows backplane 140 and two example wide backplanes, backplane 350A and backplane 350B. FIG. 4C portrays backplane 140 and an example combination of a wide and a narrow backplane, backplane 350 and backplane 150, respectively.

In one example, backplanes located or mounted in upper air plenum 106A include communication interfaces 152A-M and 154A-M to couple to communication interfaces on modules received in front slots 102A-M or rear slots 104A-M. In this example, backplanes located or mounted in lower air plenum 106B include communication interfaces 156A-M and 158A-M to couple to communication interfaces on the modules received in the front and rear slots.

In one example, for each of the three backplane combinations, front board 110 and RTM 210 include communication interfaces 114, 116 and 224, 226, respectively, to couple to either the two narrow, two wide or a combination of wide and narrow backplanes. As depicted in FIGS. 4A-C these communication interfaces couple to communication interfaces 152C and 154C for a backplane mounted in upper air plenum 106A and couple to communication interfaces 156C and 158C for a backplane mounted in lower air plenum 106B. As described above, for interconnects 114A and 224A, an interconnect may be configured to couple a fabric interface to a communication channel via combinations of various interconnect configurations (e.g., retractable, flexible signal medium, optical path) to couple in different manners (e.g., impedance controlled, optical, inductive, capacitive).

Figure 5A:
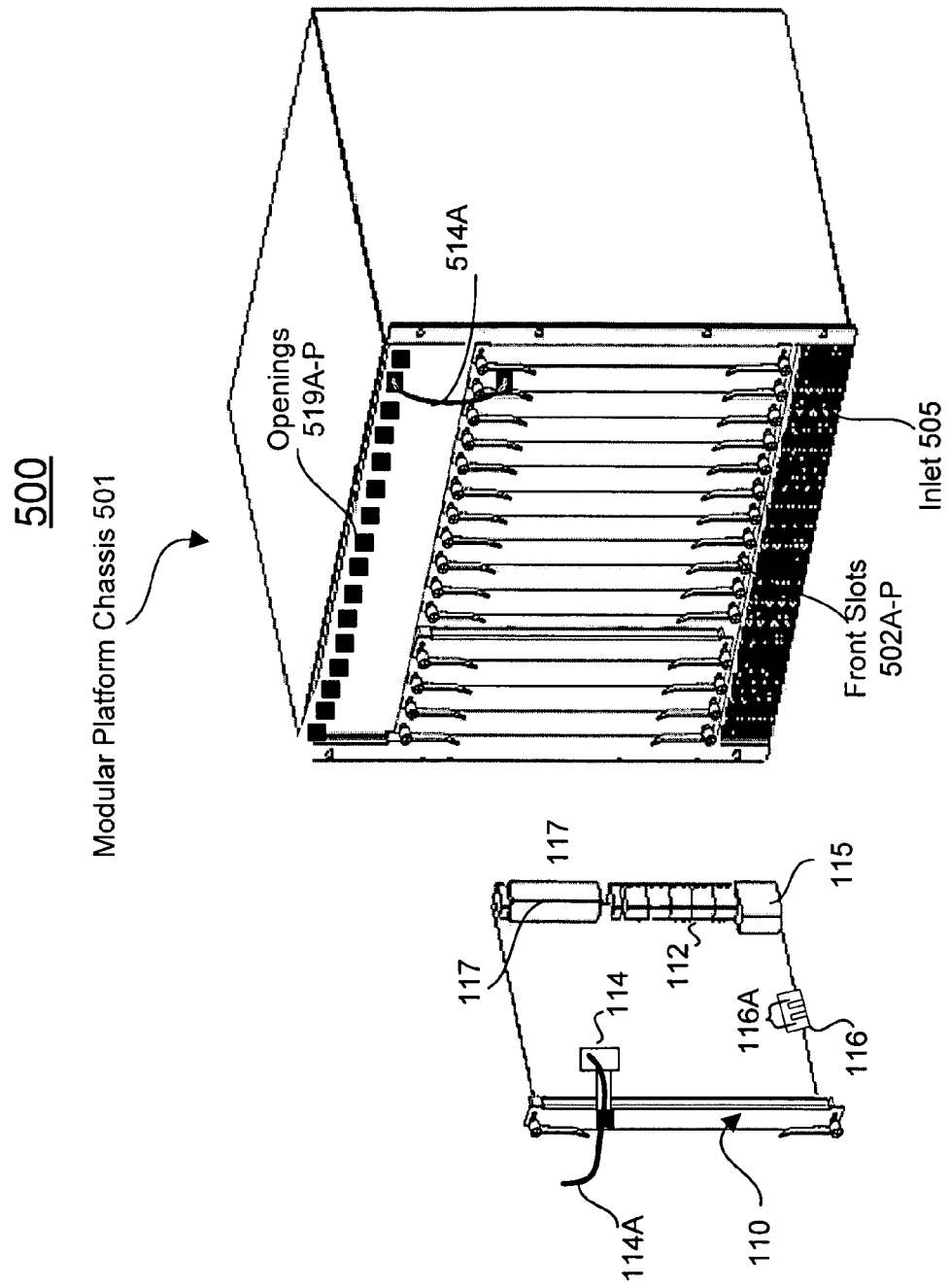
FIG. 5A is an illustration of an example modular platform system with a module to be received in an example modular platform chassis.
Figure 5:
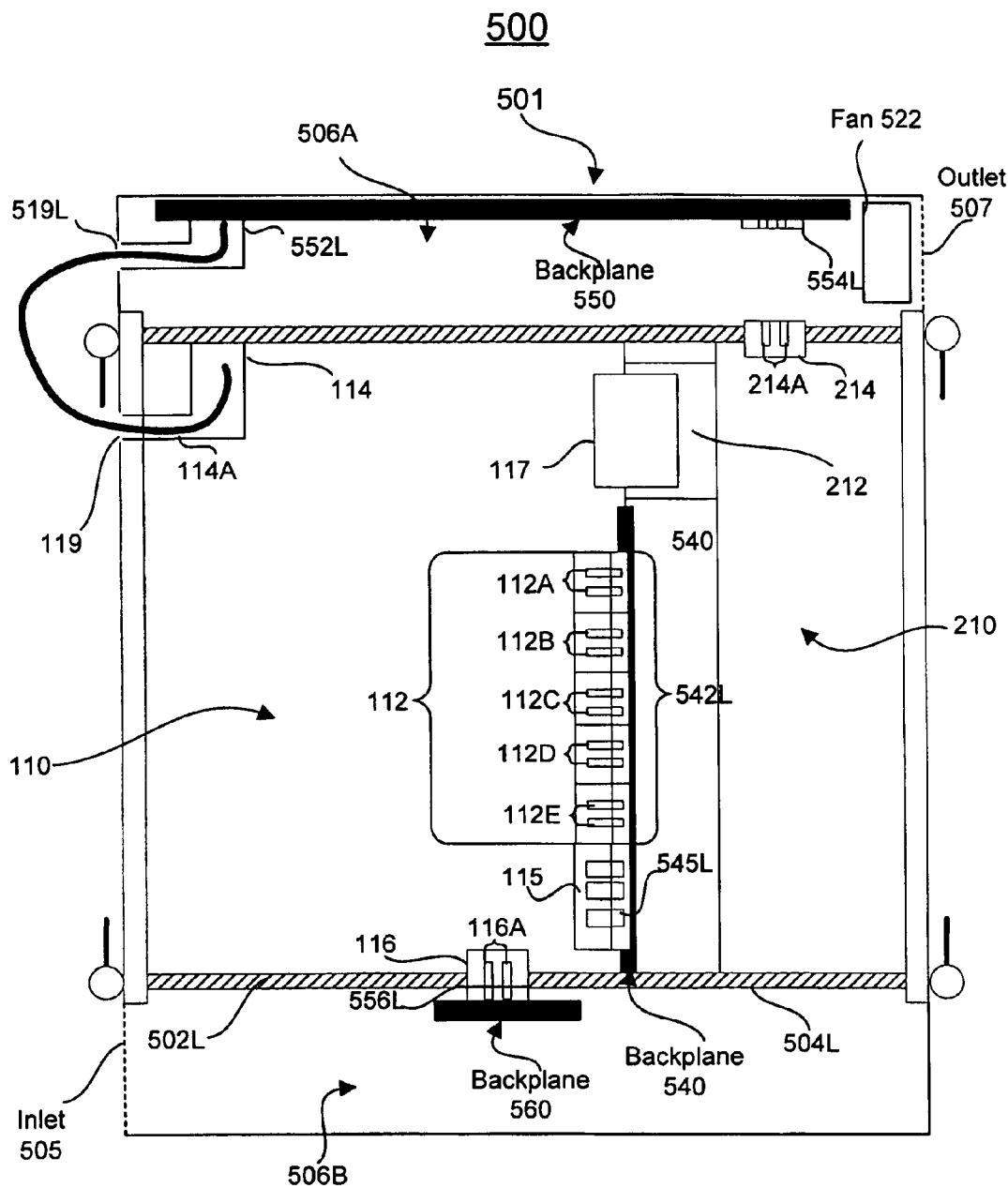
FIG. 5B provides a side view of a portion of the example modular platform system.

FIG. 5A is an illustration of an example modular platform system 500 with front board 110 to be received in modular platform chassis 501. As shown in FIG. 5A, modular platform chassis 501 includes front slots 502A-P. In one example, similar to modular platform chassis 101, as described above, modular platform chassis 501 includes a plurality of backplanes to couple to communication interfaces on modules inserted in slots in modular platform chassis 501. Although not shown in FIG. 5A, in one example, modular platform chassis 501 also includes rear slots 504A-P to receive modules (e.g., RTMs) from the rear.

In one example, modular platform chassis 501 includes openings 519A-P. Openings 519A-P may facilitate the routing of an interconnect from a front board inserted in slots 502A-P to a backplane in modular platform chassis 501. For example, as shown in FIG. 5A, interconnect 514A is configured to include a flexible signal medium that is routed through opening 519B.

FIG. 5B, provides a side view of a portion of modular platform system 500 with front board 110 received in front slot 502L of modular platform chassis 501. As shown in FIG. 5B, modular platform chassis 501 includes three backplanes, backplane 540, backplane 550 and backplane 560. In one implementation, backplane 540 is a backplane similar to the backplane 140 described above. In that regard, backplane 540, for example, is designed in compliance with the ATCA specification.

As shown in FIG. 5B, backplane 550 is a wide backplane located at the upper portion of upper air plenum 506A. In one example, backplane 550 includes communication interfaces 552A-P and 554A-P to couple to communication interfaces on modules received in modular platform chassis 501's front slots 502A-P and rear slots 504A-P, respectively. In one example, similar to that described for FIG. 3A above, interconnect 114A is configured to include a flexible signal medium that is used to couple a fabric interface associated with communication interface 114 to a communication channel routed to communication interface 552L and over backplane 550. As described above, interconnect 214A for communication interface 214 on RTM 210, for example, may be configured to couple a fabric interface to a communication channel routed to communication interface 554L and over backplane 550.

As portrayed in FIG. 5B, backplane 560, in one example, is a narrow backplane located or mounted at the top portion of lower air plenum 506B. However, in this example, unlike the example narrow backplanes described above, backplane 560 does not couple to communication interfaces on modules received in rear slots 504A-P. For example, backplane 560 includes communication interfaces 566A-P to couple to communication interfaces on modules received in front slots 502A-P. In one implementation, the exclusion of a communication interface to couple to a module received in the rear slots allows for a narrower backplane that may further reduce the obstruction of airflow through modular platform chassis 501.

In one example, interconnect 116A in communication interface 116 is configured to couple a fabric interface associated with communication interface 116 to a communication channel routed to communication interface 566L and over backplane 560. As described above, interconnect 116A, for example, is configured to couple via various manners (e.g., impedance controlled, optical, inductive, capacitive).

Figure 6:
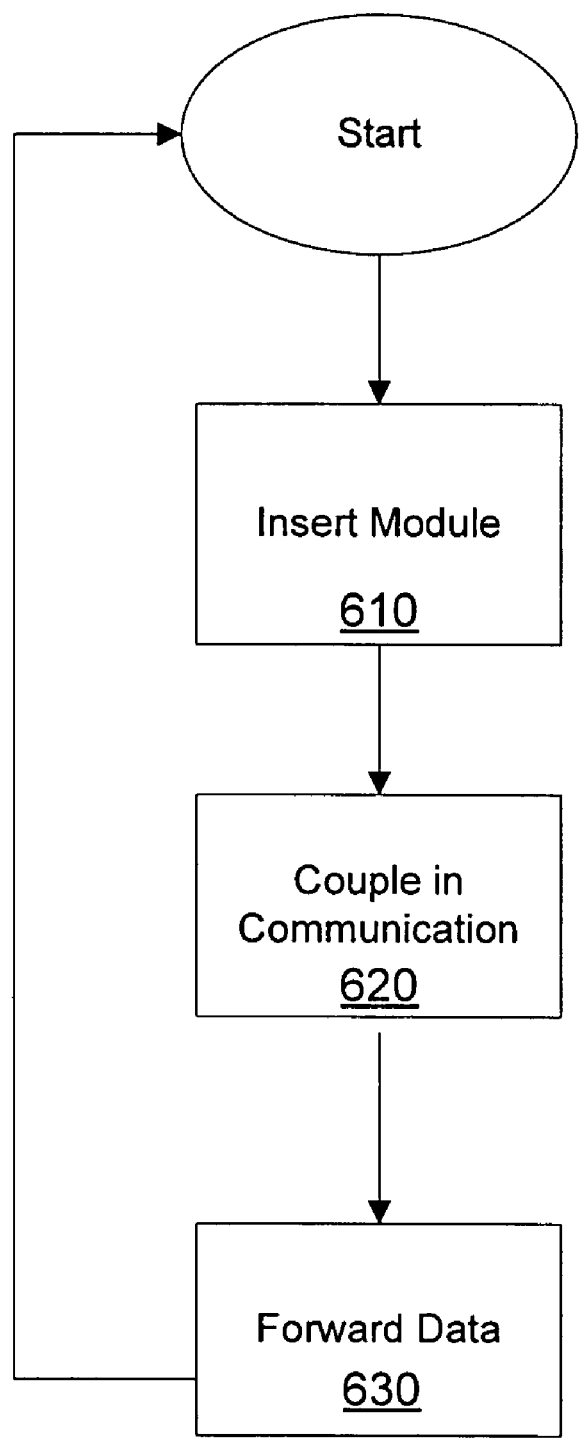
FIG. 6 is a flow chart of an example method to insert the module into the slot in the modular platform chassis to couple the module to a plurality of backplanes.

FIG. 6 is a flow chart of an example method to insert a module into a slot in a modular platform chassis to couple the module to a plurality of backplanes. In one implementation, the example method is implemented when front board 110 is inserted in slot 502L in modular platform chassis 501 as described for FIGS. 5A-B. In this example implementation, backplane 540 in modular platform chassis 501 operates in compliance with the ATCA specification. Additionally, the fabric interface associated with communication interface 112 on front board 110 operates in compliance with the ATCA specification.

The process begins in block 610, where in one example, front board 110 is inserted in front slot 502L of modular platform chassis 501.

In block 620, in one example, front board 110 couples to the backplanes in modular platform chassis 101. For example, communication interface 112 couples to communication interface 542L on backplane 540. Interconnects 112A-E, for example, are configured to couple a fabric interface associated with communication interface 112 to a communication channel routed over backplane 540. The communication channel, for example, to couple front board 110 in communication with other modules received or inserted in modular platform chassis 501's front slots.

As described above for FIG. 5B, in one example, interconnect 114A is used to couple communication interface 114 on front board 110 to communication interface 552L on backplane 550. This coupling, for example, uses an interconnect 114A configured to include a flexible signal medium to couple a fabric interface associated with communication interface 114 to a communication channel routed through backplane 550 in either an impedance controlled, optical, inductive or capacitive manner. Also as described above, interconnect 116A can be configured to couple a fabric interface associated with communication interface 116 to a communication channel routed to communication interface 556L and over backplane 560.

In block 630, in one example, data is forwarded between front board 110 and one or more other modules inserted or received in other slots in modular platform chassis 501. At least portions of this data, for example, is forwarded from the fabric interfaces associated with communication interfaces 112, 114 and 116 and then through portions of the communication channels routed over backplanes 540, 550 and 560, respectively.

In one implementation, fabric interfaces associated with communication interfaces (e.g., 512) that couple to backplane 540 utilize one or more packet-based, communication protocols as described in the PICMG 3.x specifications and backplane 540 supports or operates in compliance with these PICMG 3.x specifications. In one example, the fabric interfaces included in communication interfaces (e.g., 514 and 516) that couple to backplanes 550 and 560 utilize either packet-based (PICMG 3.x) or TDM-based (TFI-5) communication protocols. This utilization is based, for example, on what type of communication protocol backplanes 550 and 560 are designed to support (e.g., PICMG 3.x or TFI-5).

The process then starts over, for example, when another module is inserted in a slot on modular platform chassis 501.

In the previous descriptions, for the purpose of explanation, numerous specific details were set forth in order to provide an understanding of this disclosure. It will be apparent that the disclosure can be practiced without these specific details. In other instances, structures and devices were shown in block diagram form in order to avoid obscuring the disclosure.

References made in this disclosure to the term "responsive to" are not limited to responsiveness to only a particular feature and/or structure. A feature may also be "responsive to" another feature and/or structure and also be located within that feature and/or structure. Additionally, the term "responsive to" may also be synonymous with other terms such as "communicatively coupled to" or "operatively coupled to," although the term is not limited in his regard.

What is claimed is:

1. A chassis comprising:
   a plurality of slots to receive modules;
   a first backplane to couple to modules that are received in the slots, the modules to couple via a first communication interface on each module;
   a second backplane to couple to at least a subset of the modules received in the slots, the subset of modules to couple via a second communication interface on each of the subset of modules; and
   two air plenums located above and below the slots, wherein the first backplane is mounted in one of the air plenums.

2. A chassis according to claim 1 further comprising:
   a third backplane to couple to modules that are received in the slots, the modules to couple via a third communication interface on each module, wherein the first backplane is mounted in the air plenum located above the slots and the third backplane is mounted in the air plenum located below the slots.

3. A chassis according to claim 1, wherein the first backplane couples to the first communication interface on each module through at least one interconnect in the first communication interface.

4. A chassis according to claim 3, wherein the second backplane couples to the second communication interface on each of the subset of modules through at least one interconnect in the second communication interface.

5. A chassis according to claim 3, wherein the interconnect comprises the interconnect configured to couple in at least one manner selected from the following group of: an impedance controlled manner, an optical manner, an inductive manner and a capacitive manner.

6. A chassis according to claim 5, wherein the second backplane operates in compliance with the Advanced Telecommunications Computing Architecture specification.

7. A chassis according to claim 1, wherein the second backplane and the subset of modules received in the slots that couple to the second backplane operate in compliance with the Advanced Telecommunications Computing Architecture specification.

8. A method comprising:
inserting a module in a slot in a chassis, the module including a first communication interface to couple to a first backplane and a second communication interface to couple to a second backplane, both backplanes located within the chassis, the chassis further including two air plenums located above and below the plurality of slots, the second backplane mounted in one of the air plenums;
coupling in communication the module to another module inserted in another slot in the chassis, the coupling in communication via the module's communication interfaces; and
forwarding data between the module and the other module, the data forwarded through at least one communication interface coupled to the first backplane and/or through at least one communication interface coupled to the second backplane.

9. A method according to claim 8, wherein coupling in communication via the first communication interface to couple to the first backplane includes:
an interconnect configured to couple in an impedance controlled manner.

10. A method according to claim 8, wherein coupling in communication via the module's second communication interface includes:
an interconnect configured to couple in at least one manner selected from the following group of: an impedance controlled manner, an optical manner, an inductive manner and a capacitive manner.

11. A method according to claim 10, wherein the second backplane operates in compliance with the Advanced Telecommunications Computing Architecture specification.

12. A method according to claim 11, wherein the first backplane operates in compliance with the Time Division Multiplexing Fabric to Interface Implementation (TFI-5) specification.

13. A system comprising:
a chassis including a plurality of slots to receive modules and a plurality of backplanes to include a first and a second backplane, the chassis further including two air plenums located above and below the plurality of slots, the second backplane mounted in one of the air plenums;
a module received in a first slot of the plurality of slots; and
another module received in a second slot of the plurality of slots, the other module to include:
a first communication interface to couple the other module to a first backplane in the chassis via an interconnect configured to couple a fabric interface associated with the first communication interface to a communication channel routed over the first backplane to the module received in the first slot; and
a second communication interface to couple the other module to a second backplane in the chassis via an interconnect.

14. A system according to claim 13, wherein the chassis includes a third backplane and the other module includes a third communication interface to couple the other module to the third backplane via an interconnect.

15. A system according to claim 13, wherein the interconnect comprises the interconnect configured to couple in at least one manner selected from the following group of: an impedance controlled manner, an optical manner, an inductive manner and a capacitive manner.

16. A system according to claim 13, wherein the module received in the first slot comprises a switch module.

17. A system according to claim 16, wherein the first backplane, the switch module and the other module operate in compliance with the Advanced Telecommunications Computing Architecture specification.

* * * * *